United States Patent [19]

Quick

[11] 4,447,783

[45] May 8, 1984

[54] PROGRAMMABLE RF POWER REGULATOR (STABILIZER)

[75] Inventor: Donald L. Quick, Mountain View, Calif.

[73] Assignee: The Perkin-Elmer Corp., Norwalk, Conn.

[21] Appl. No.: 379,696

[22] Filed: May 19, 1982

[51] Int. Cl.³ .............................................. H04B 1/04
[52] U.S. Cl. .................... 323/275; 323/280; 330/207 P; 455/115; 455/117
[58] Field of Search ............... 323/273, 274, 275, 280, 323/349; 340/657, 660, 664; 330/105, 108, 110, 207 P, 298; 455/115, 117

[56] References Cited

U.S. PATENT DOCUMENTS

| | | | |
|---|---|---|---|
| 3,852,669 | 12/1974 | Bowman et al. | 455/117 |
| 3,866,136 | 2/1975 | Augustin et al. | 455/117 X |
| 3,870,957 | 3/1975 | Straw | 455/115 X |
| 4,122,400 | 10/1978 | Medendorp et al. | 330/207 P |
| 4,276,591 | 6/1981 | Quick | 323/254 |
| 4,287,466 | 9/1981 | Quick | 323/275 |

Primary Examiner—Peter S. Wong
Attorney, Agent, or Firm—F. L. Masselle; T. P. Murphy; J. R. Dwyer

[57] ABSTRACT

Disclosed is a regulator circuitry (stabilizer) for controlling the output of an RF generator according to a programmable input signal. A power stage is responsive to the selected value of the programmable input signal to drive the RF generator at the desired power level. A forward power feedback control circuit monitors and controls the power output stage so that the desired RF output level is maintained at a constant level. In this particular mode of operation, RF output power is maintained constant and therefore independent of variations in gain due to temperature changes and other parameters which could effect the overall transfer function of said generator (and including mismatch of the generator into the load).

When the stabilizer is selectively placed in a second operational mode, namely bias regulation, a different parameter, target bias voltage, is maintained at a constant level, independent of variations in the generator's transfer function such as gain changes due to temperature and so forth as mentioned above.

A reflected power control feedback circuit limits the reflected power to a predetermined signal level and is arranged to reduce the signal applied to the power output stage to reduce the forward power whenever the reflected power exceeds the selected fixed level although the forward power will not be reduced below a level sufficient to support some reflected power. Forward power will never be reduced below the level required to support and maintain the reflected power level at the magnitude representing the reference voltage selected by the adjustment potentiometer connected to the reflected power sensors' non-inverting input.

8 Claims, 3 Drawing Figures

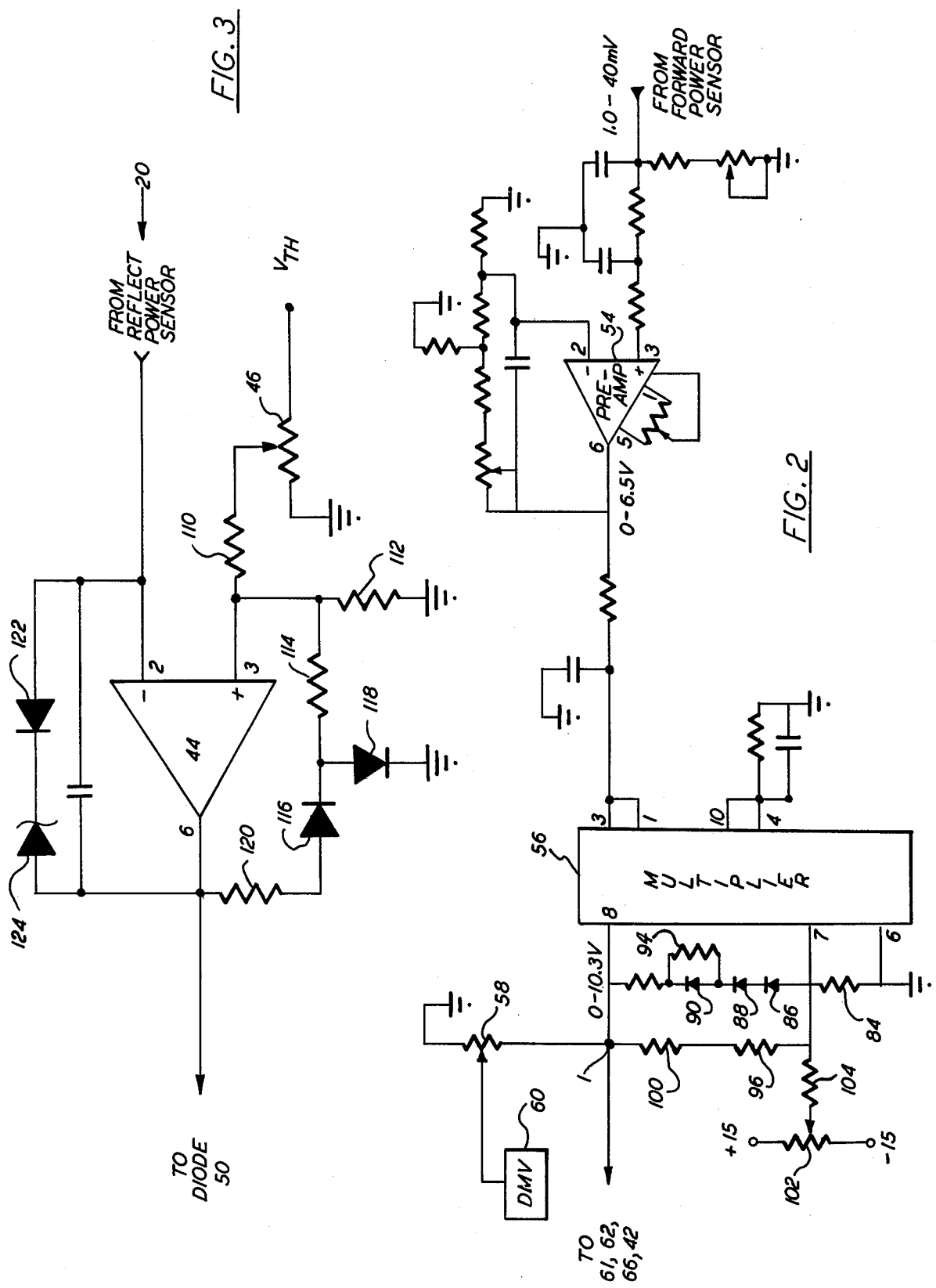

PROGRAMMABLE RF POWER REGULATOR (STABILIZER)

CROSS-REFERENCE TO RELATED APPLICATION

The invention disclosed herein includes a novel wattmeter which is separately disclosed and claimed in a copending application of D. Quick, Ser. No. 378,690, filed May 17, 1982.

BACKGROUND OF THE INVENTION

This invention relates to electrical power regulation, and particularly to a regulated power supply that drives an RF generator feeding into a load of varying impedances.

Typical applications for such a power supply include the regulation of power to cathode sputtering systems for assuring that the power applied to a deposition target will remain constant during changing conditions that very not only the load but the impedance characteristics that produce appreciable quantities of power reflected back from the load to the generator.

One example of a typical application of a regulated power supply for use in cathode sputtering systems is disclosed in the U.S. Pat. No. 4,287,466 to Quick where the regulator was responsive to both the rectified RF voltage applied across the load (forward power) and to the reflected power sensed in the transmission line so that the forward power was adjusted to a level which caused only a fixed or limited amount of reflected power to be maintained, thereby causing heat dissipation to remain at a safe level and to provide a continuing reduction in forward power as losses increased because of deteriorating failure conditions.

Another example of a regulated power supply for constant output power to be dissipated in varying loads, such as encountered in cathode sputtering systems, is disclosed in the U.S. Pat. No. 4,276,591 to Quick where the circuitry measured both the rectified DC load voltage and current and generated a corresponding voltage signal which was combined into a product multiplier to obtain a product voltage proportional to the DC output power. This product voltage was compared with an externally supplied DC control signal representing the desired power output. The comparator output signal controlled a pass element that varied the saturation current in saturable reactors in the AC power input lines to the rectifier circuitry. The power supply included a limiter circuit responsive to either the voltage signals corresponding to the measured voltage, load current, or product voltage which was calibrated to a desired threshold level. When the power, voltage and/or current exceeded a desired threshold level, a limiter took control of the pass element bypassing the comparator to thus maintain the output of the power supply at a predetermined safe level.

This latter circuitry had the advantage over other types of regulated power supplies in that it did not rely on the difference in forward and reflected power reaching a certain ratio, such as disclosed in the U.S. Pat. No. 4,122,400 to Medendorp et al., but separated and treated the forward and reflected power in a manner whereby the RF generator was protected independently of any ratio.

SUMMARY OF THE INVENTION

This invention comprises regulator circuitry for controlling the output of an RF generator according to a programmable input signal. The power stage of the system is responsive to the selected value of the input signal from the programmable source to drive the RF generator at the desired power level. A forward power feedback control circuit is provided for monitoring and controlling the regulators' output stage so that the desired output power level of the RF generator is maintained. In one mode RF forward power is maintained constant and, in another mode, target bias is maintained constant. In either mode, the particular selected feedback signal is algebraically summed with the signal from the programmable input for controlling the power output from the RF generator as a function of the particular selected error signal. In the forward power feedback circuit, a non-linear signal, derived from a forward power measuring device, located between the RF generator and a load, is applied to a signal processing means which reshapes the non-linear signal to form a signal linearly proportional to power, rescaled to be visually displayed directly in watts of RF forward power over the entire scale of a digital voltmeter. Simultaneously, the voltage level developed across target is visually displayed on a second digital voltmeter.

A reflected sense/forward power limit circuit is responsive to a signal from a reflected power measuring device for reducing and therefore limiting reflected power (by simultaneously reducing forward thus reducing reflected power) as compared to a predetermined threshold signal level applied to the sensing circuit. This compared signal is summed with programmable input signal (or reference voltage) to thereby reduce this reference voltage in order to reduce the generators' forward power if the reflected power exceeds the predetermined threshold level applied to the sensing circuit.

As will be clear to those skilled in the art, the forward power is capable of being continuously varied from zero to a predetermined wattage or to the full rated power of a given generator at the same time the reflected power level is fixed at a predetermined level but is capable of functioning while the forward power is at any level.

BRIEF DESCRIPTION OF THE DRAWINGS

FIGS. 2 and 3 are enlarged and more detailed schematic drawings of certain components shown in FIG. 1.

DETAILED DESCRIPTION

Figure 1:
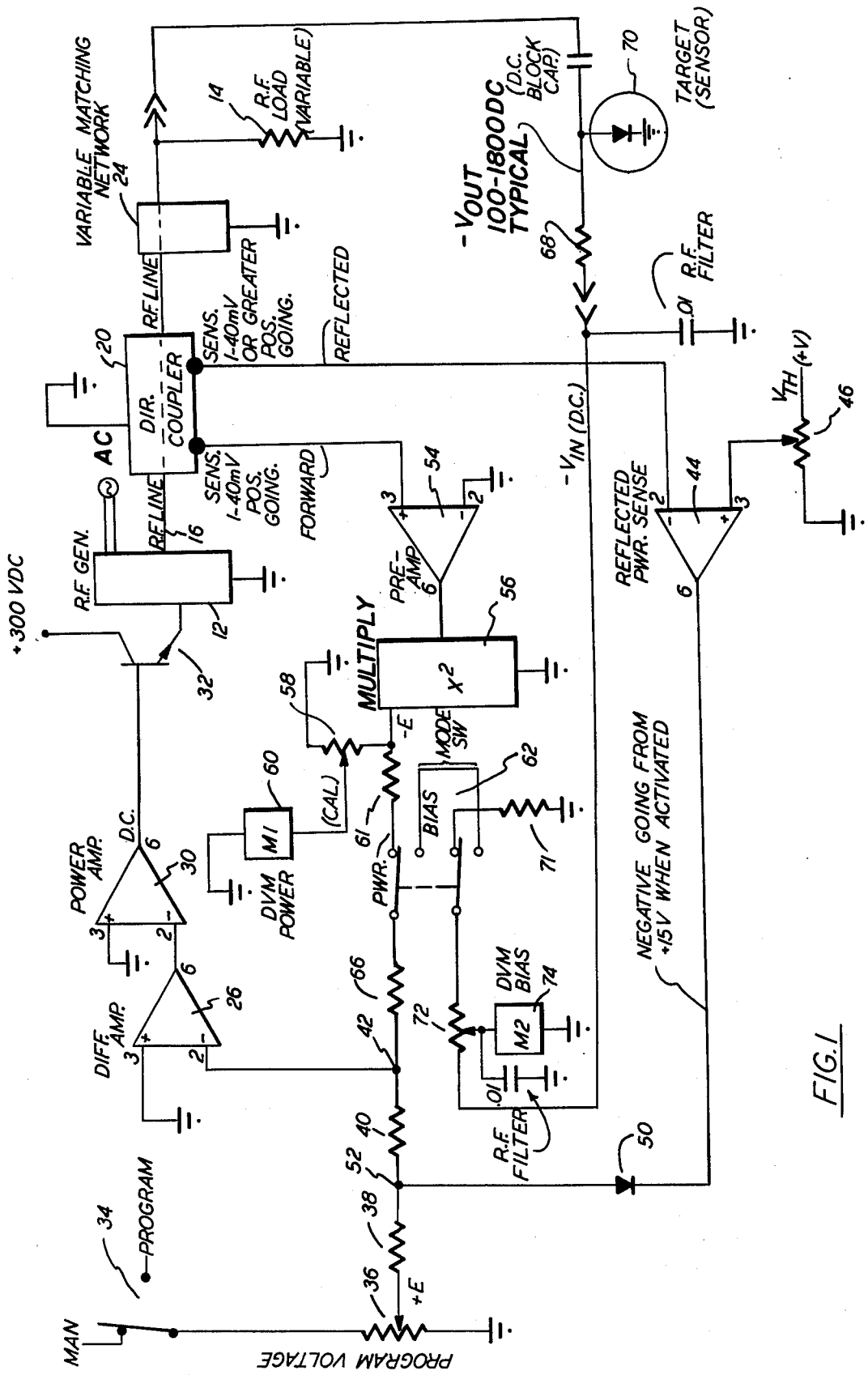
FIG. 1 is a simplified schematic block diagram of the invention.

Illustrated in the block diagram of FIG. 1 is an RF generator 12, which, in the preferred embodiment, is the type normally used for providing large quantities of energy in the order of 1 to 5 KW to a deposition target electrode or load 14 in a cathode sputtering system. The RF energy applied to the target is transmitted via a transmission line 16 through a directional coupler 20 and via a second transmission line 22 through a variable matching network 24 to the load 14. The matching network 24 is an automatically servoed device which senses the relationship of the RF voltage and current variations in the transmission line, thereby producing impedance matching between the load and the RF generator. This device is a commercially available device, one such device is produced by The Perkin-Elmer Corporation of Norwalk, Connecticut and identified as a "Servo-Match" or "Auto-Tune" device. The directional coupler 20 includes means for sensing the forward and reflected power in the transmission lines and provides output signals porportional to their respective amplitudes. This directional coupler is also a commercially available device produced by Bird Electronics Corp. of Cleveland, Ohio and identified as a "Thru-Line Coupler with interchangeable sensing elements."

Both the forward power and the reflected power are subject to regulating circuits with the forward power regulating circuit forming one feedback path and the reflected power regulating circuit as a second, alternate, feedback path to a comparator, differential amplifier 26, and output power stage, comprising a driver, operational amplifier 30, and output power transistor 32. Both operational amplifiers may be of the type 741 and suitable voltage level shifters and base current drivers are included in this power stage.

The forward power regulating circuit is programmable from a source of positive voltage selected by switch 34 from either, a manually controlled source, a microprocessor, or other external control device, and coupled to a potentiometer 36 whose wiper arm is connected between this positive voltage source and ground. The wiper arm is also connected to a pair of series connected resistors 38 and 40 and at junction 42 to the inverting input of the comparator 26. The non-inverting input of this amplifier is at ground. The setting of this programmable potentiometer voltage source determines the output level for the RF generator 12 and load 14.

The reflected power regulating circuit is a limiter circuit in which the signals representing the amplitude of reflected power from the directional coupler 20, are applied to the inverting input of a comparator, operational amplifier 44 (type 741). This operational amplifier 44 compares this signal level to a threshold voltage level applied to the non-inverting input of amplifier 44 via the wiper arm of a potentiometer 46 connected between a positive DC reference voltage and ground. The threshold voltage level may be preset to a predetermined value for limiting at the desired amplitude of reflected power. The output of the comparator 44 is coupled to the cathode of a disconnect diode 50 (type 914) whose anode is connected to a voltage reference junction 52 between the two resistors 38 and 40.

In the feedback path of the forward power regulating circuit, signals representing amplitudes of the forward power from the directional coupler 20, are applied to the non-inverting input of a pre-amplifier, operational amplifier 54, of the popular 741 type, whose inverting input is referenced to ground. The output of preamplifier 54 is connected to a multiplier 56 of the type produced by Analog Devices Corp. of Norwood, Mass. and identified as type AD 534. The output of the multiplier 56 is a negative voltage signal coupled to a potentiometer 58 (25K) whose wiper arm is connected to wattmeter 60. The preamplifier 54, multiplier 56, potentiometer 58 and voltmeter 60 together form a wattmeter scaled to represent directly in watts the amount of forward power on the scale of the digital voltmeter 60 which is separately disclosed and claimed in the copending application, identified supra. The output of this multiplier is also applied, through resistor 61, (68K), double pole-double throw mode switch 62 (one position), and resistor 66 (10K) to junction 42, the inverting input of differential amplifier 26 and to the end of resistor 40.

The signal in the feedback path, thus far described, is an error signal applied to the comparator 20 so that the system will correct for the error to maintain the RF power constant. The other position of mode switch 62 is arranged to connect resistor 68 and target 70 (shown as a shunt connected diode) through potentiometer 72, so that a target bias signal of a negative going voltage will be applied to resistor 66, to junction 42, and to the inverting input of comparator 26. The wiper arm of potentiometer 72 (10K) connects a second digital voltmeter 74 to the bias input signal so that the target bias voltage can be visually displayed. This signal from the target is an error signal applied to the comparator so that the system will correct for the error to maintain the selected target bias voltage constant.

It should be pointed out, that both digital wattmeter as well as digital voltmeter remain connected to their respective signal sources for continuous monitoring independent of the operational mode selected by mode switch 62, and that the mode switch primarily determines whether the circuitry regulates the forward RF power or conversely regulates target bias voltage. Additionally, a section of the mode switch, by necessity, substitutes resistor 71 (10K) for maintaining termination of the bias metering circuit when the power regulating mode is selected.

Briefly described, it can be seen from the foregoing description that an input programming reference of positive voltage is selected at the potentiometer 36 from either a manually adjustable reference voltage or an external voltage source by the switch 34. The output voltage of the potentiometer 36 (10K ohms) is precisely scaled to develop an arbitrary voltage (+5 VDC) for full scale power from the RF generator. This voltage is applied through resistors 38 and 40 (2K and 5.6K respectively) to the summing junction of differential amplifier 26. Any increase or decrease in the selected voltage will provide a corresponding increase or decrease in the power output from the RF generator which is sensed as forward power in the directional coupler and applied to the preamplifier 54, to multiplier 56 and to the voltmeter 60. The multiplier with its output circuitry, called an "equalizer", which will be described in more detail hereinafter, corrects the non-linear signal from the forward power sensor of the directional coupler 20 as a negative going linear signal displayed on the voltmeter as Watts. When the mode switch 62 is in the position shown, the signal from the "equalizer" is also applied concurrently to the differential amplifier 26, and when equilibrium is reached between the reference voltage from the potentiometer 36 and the negative output of the "equalizer", the RF power is at the desired level and will remain so until changed by adjusting the input voltage level from the potentiometer 36 or unless the reflected power exceeds a predetermined limit. During normal operation, the variable matching network 24 will sense, within limits, mismatches representing changes in reflected power and make suitable corrections in a manner whereby the transmission line is maintained correctly matched.

When the mode switch 62 is switched to connect the target bias sensor as a negative going signal, the signal from this latter sensor is applied to the differential amplifier 26 and when equilibrium is reached between the reference voltage from the potentiometer 36 and the negative output from the bias sensor, RF power is automatically adjusted by the feedback loop, to the RF level needed to maintain a constant bias and will remain so until changed by a change in the input voltage level from potentiometer 32, or a change in the target bias signal or whenever the reflected power exceeds a predetermined limit.

The reflected power regulating circuit normally lies in a dormant state when the reflected power is below a value which is selected by the preset voltage threshold from potentiometer 46 as applied to the reflected power amplifier 44. The voltage applied is such that the diode 52 is reverse biased or cut off. However, when the reflected power exceeds a selected value, this increased input signal voltage is applied to the inverting input of amplifier 44 so that the positive output voltage from the amplifier is reduced, i.e., made less positive. When the output voltage from amplifier 44 is reduced to the point where the disconnect diode 50 becomes forward-biased, the negative going output voltage source reduces the positive voltage at the reference voltage junction 52 which reduces the positive voltage applied to the comparator, causing the power stage to reduce its voltage applied to the RF generator until the reflected power reduces to at least that value represented by the reference voltage placed into the reflected power sensors non-inverting input. This reduction is forward power is, of course, followed by a decrease in the feedback signal applied to the preamp and equalizer, the result of which is visually displayed on the voltmeter 60 representing actual forward power.

Having thus described the overall operation of the invention, certain details of the circuit will be described as a specific example of an operable circuit.

Turning now specifically to FIG. 2, the output of the forward power sensing element of the directional coupler is thus connected to the non-inverting input of the preamplifier 54. This input is provided with a potentiometer 80 whose resistance of 1K ohms is connected in series with a fixed resistor 82 of 910 ohms between this input and circuit ground to provide a trim for model-to-model variations in the output of the sensing element. The operational amplifier 54 is provided with a negative feedback loop which also has a potentiometer 84 of 50K ohms for trimming the gain for a full scale voltage of +6.5 VDC (when input voltage equals 40 mV) to be applied to the multiplier 56 (input pins 1 and 3) so that the signal applied to the multiplier is within the correct range for proper multiplication. Suitable resistors and capacitors are provided for the operational amplifier for zero offset adjustment, for elimination of RF, noise, and to provide frequency roll-off. A suitable resistor and capacitor network is provided on the input side of the equalizer for preventing extraneous signals from entering the equalizer and provides the inputs to the equalizer with current limiting protection.

The typical range of output from the sensor or directional coupler 20 is about 1 to 40 mV for full scale range of RF which is less than two decades of usable voltage change and therefore insufficient to furnish three or more decades of voltage change for a conventional digital voltmeter display; hence the need for multiplier. This "equalizer" circuit reshapes and expands the forward sensor signal as amplified by the preamplifier for the full scale range of RF power from near zero to any power level detectable by interchangeable RF sensing elements. Elements are available to tens of thousands of Watts with their outputs all standardized to approximately 40 mVDC full-scale. Therefore, the wattmeter output display range is limited only by the sensing element.

The normal function of the multiplier is to provide an output which is the square of the input voltage which can then be applied to a digital voltmeter. However, since some sensing elements of the directional coupler such as the coupler from Bird Electronics Corp., supra, provide a signal which is non-linear over certain portions of its output. The output from the multiplier 56 must be modified to provide a linear signal to the voltmeter 60. This is accomplished in the embodiment illustrated by an output feedback network comprising a plurality of resistors and diodes interconnected with the output (pins 6, 7 and 8) of the multiplier. Thus, between pins 6, 7 and 8 on the output side of the multiplier, there is provided a resistor 84 of 9.1K ohms between pins 6 and 7 and between pins 7 and 8, a plurality of series connected diodes 86, 88 and 90 (914s) and resistor 92 of 10K ohms all in series with resistor 84. Diode 90 also has a shunting resistor 94 of 12K ohms connected in parallel therewith. Also connected in parallel with the series connected diodes 86–90 and resistor 92 is another pair of resistors 96 and 100, 120K and 18K ohms, respectively. These are connected between pins 7 and 8. Pin 7 is also connected to a potentiometer 102 of 50K ohms via a resistor 104 of 4.7 megohms to correct for DC error internal to the multiplier. The voltmeter 60 is then connected to the common output node 1 via a trimmer potentiometer 106 of 25K ohms for calibration of full scale numerical value readout of RF power. Node 1 is also connected to potentiometer 58, mode switch 62, resistor 66 and junction 42.

The output response of the multiplier is thus modified or tailored to change at various points as the output (pin 8) of the squaring circuit progresses from 0.0 V toward 10.3 VDC as the input signal increases to +6.5 VDC full scale from the preamplifier 54. This is in accordance with the feedback current between the output (pin 8) and the internal amplifier's summing junction (pin 7) within the multiplier itself. The output of the multiplier is therefore an exact square of its input for input levels less than the magnitude of the forward bias voltage of approximately 1.5 VDC applied to the array of three series connected diodes 86–90 across the multiplier's output terminals. (Since a typical silicon diode actually will initiate conduction at a voltage drop less than the commonly accepted 0.6 V to 0.7 V, the output level of 1.5 V is utilized for purposes of discussion.)

In the embodiment illustrated, resistors 96 and 100 total 138K ohms and determine the maximum gain of the linear internal amplifier for output levels below the level at which the three diodes begin to conduct, i.e., 1.5 V. The maximum gain point is determined by the ratio of the sum of resistors 96 and 100 to resistance of resistor 84 or 9.1K ohms. When the voltage output rises enough that diodes 86 and 88 start to conduct, the internal amplifier output begins to augment forming a break point in the response amplitude. The third diode 90 eventually begins conduction as the feedback current through the series overcomes the shunting effect of resistor 94 connected across diode 90, thereby establishing another break point. Resistor 92 provides a limit to the feedback current appearing in the series string as the multiplier output rises to the full scale limit 10.3 VDC approx. Resistor 92 in conjunction with the diodes create still another break point for the voltage levels below full scale and are affected by the ratio of their value of 10K to the resistance of 138K of the combination of resistors 86 and 90.

FIG. 3 illustrates the reflected power feedback circuitry in more detail. It can be seen that threshold adjusting potentiometer 46 supplies a positive bias voltage through a resistor 110 of 100K to the non-inverting input of operational amplifier or comparator 44. This adjustment is scaled so that approximately +1.0 V corresponds to the input level of +100 mV on this inverting input. There is no negative DC feedback path (no resistor) from the output to the inverting input of this amplifier and therefore, only a few millivolts from the threshold potentiometer 46, will cause the comparator output to swing to nearly +15 V. The positive feedback loop comprises resistor 112 of 10K ohms connected at one end to one end of resistor 114 of 1 megohm. The other end of resistor 114 is connected to the cathode of diode 116 and to the anode of diode 118; the latter's cathode being connected to ground. The anode of diode 116 is connected to the output pin of the amplifier through resistor 120 of 10K ohms. Positive feedback is applied to the non-inverting input when the output drives positive enough to forward bias diode 116. Therefore, positive feedback switches more bias into the inverting input when the operational amplifier's output rises above approximately +0.5 V. This is an overdrive condition (positive feedback) which adds approximately an additional 5.0 millivolts (hysteresis) on the non-inverting input. The output thus is firmly latched near the +15 V level. Diode 50 is thus reversed biased since its anode can never be more positive than the voltage as supplied by the programmable voltage potentiometer 36 at reference junction 52.

As stated above the reflected power sense circuit comprising the operational amplifier normally lies in a dormant state with the output from comparator 44 residing near +15 V. The disconnect diode 50 is therefore reverse biased or cut off.

When reflected power increases to a level which increases the positive DC signal to the non-inverting input of operational amplifier 44, the output of this amplifier begins to descend in a negative direction toward a maximum possible level of −6.0 V (approximately) where the series combination of diode 122 and zener diode 124 would clamp the negative excursion of the operational amplifier. When the output of the operational amplifier descends to a point approximately 0.5 V more negative than the positive voltage appearing at the reference junction 52, diode 50 becomes forward biased, thereby connecting the low impedance output of the operational amplifier to the reference junction 52. The output of the operational amplifier 44 continues to pull down the reference voltage at reference junction 52 until the reduced reference voltage causes the output power amplifier (transistor 32) to reduce the forward RF power output from the generator.

Operational amplifier 44 continues to reduce the forward reference voltage until a point of equilibrium is reached whereby forward power from the generator is just sufficient to maintain the magnitude of reflected power to precisely the amount corresponding to setting of threshold potentiometer 46. The point of equilibrium thus reached, reflected power becomes fixed or regulated and the forward power becomes a variable. Should another change in tunint (i.e. mismatch) initiate and the match, or mismatch continue to change after reflected power becomes regulated, forward power continues to change accordingly. Forward power will decrease still farther if reflected power attempts to rise.

When the output from the operational amplifier 44 becomes more negative than approximately +0.5 V during descent, diode 116 becomes reverse biased thereby disconnecting the positive feedback path. The overdrive (hysteresis) to the non-inverting input is removed and the amplifier output is free to move entirely as a function of reflected power and the constraints imposed upon the overall feedback via the RF generator. The sudden removal or application of overdrive (positive feedback) appears as a hysteresis or dead band during a switching transition of diode 50. The speeded switching transition of the disconnection of diode 50 enables the discontinuity of the overall feedback to be unnoticed by the remainder of the system and additionally reduces uncertainty to the reflected power sensor output.

The clamping action of the zener diode 124 and diode 122 actually allow a negative excursion of the output of the operational amplifier to possibly reach approximately −6.0 V. However, under loop control conditions, the output will drive negatively only far enough to allow the voltage at reference junction 52 to within a few mV positive with respect to circuit ground, or, in other words, that positive potential required to maintain forward power at the minimum level required for sustaining the reflected power at the threshold.

Diode 116 maintains a near constant voltage across its terminals as the output of the operational amplifier changes in a positive direction to a higher positive amplitude. This near constant voltage drop provides a near constant mV signal via resistor 114, as a fixed positive feedback, thereby making the hysteresis independent of the output level of voltage from the output of the operational amplifier.

When a correction of mismatch improves sufficiently to reduce reflected power below the threshold voltage, the reflected power sensor completely disconnects, thereby allowing forward power to once again establish forward regulation.

What is claimed is:

1. A power supply regulator for generating a regulated RF power output to a load of variable impedance at a level proportional to a voltage level of an applied input control signal comprising, power circuitry including AC power input cicuitry, input control circuitry responsive to an external control and providing said control signal voltage level which is proportional to the desired power output of the power supply, power measuring means coupled to said power circuitry for generating output voltage signals proportional to the forward and reflected power applied to said load, signal comparison means coupled to said power measuring means and to said input control circuitry for generating an output signal proportional to a signal applied to said signal comparison means which comprises the sum of said forward power voltage signal and said control signal voltage level, power control means coupled to said signal comparison means and responsive to said output signal for controlling the power output of said power circuitry, and limiting circuitry coupled to said power measuring means and responsive to said reflected power voltage signal and to a predetermined threshold voltage signal for overriding signal applied to said signal comparison means for reducing the forward power of said power circuitry whenever the reflected power signal exceeds said threshold voltage signal.

2. The power supply regulator as claimed in claim 1 further including means for generating a voltage signal as a function of RF power and applying said generated signal as a function of RF power to said signal comparison means whereby the signal applied to said signal comparison means comprises the sum of said control signal and said generated signal which is a function of RF power.

3. The power supply regulator as claimed in claim 2 further including means responsive to said last mentioned generated signal for displaying digitally voltage as a function of RF power.

4. The power supply regulator as claimed in claim 3 wherein said function of RF power is target bias.

5. The power supply regulator as claimed in claim 2 further including switching means for switching the signals applied to said signal comparison means between the forward power signal and the RF function generated signal.

6. The power supply regulator as claimed in claim 1 wherein means are provided between said signal comparison means and said forward power signal generating means for processing said forward power signal into a linear signal representing the forward power signal and means responsive to said linear signal for displaying digitally watts of generated RF power.

7. The power supply regulator as claimed in claim 6 wherein said means for processing said forward power signal into a linear signal, comprises a first amplifier coupled to said forward power signal generating means, and means coupled to said amplifier for multiplying the output signal of said amplifier to provide the signal which is a representation of the signal received from said amplifier.

8. The power supply regulator as claimed in claim 7 wherein said amplifier includes feedback circuitry to vary the gain of said amplifier through a full range of selected output voltage amplitudes according to the input to said amplifier.

* * * * *